_ _ _

United States Patent [19]
Fukuda et al.

[11] Patent Number: 5,458,083
[45] Date of Patent: Oct. 17, 1995

[54] GROWTH METHOD FOR A ROD FORM OF SINGLE OXIDE CRYSTAL

[75] Inventors: Tsuguo Fukuda, Sendai; Keigo Hoshikawa, Nagano; Hiroshi Machida, Kumagaya, all of Japan

[73] Assignee: Chichibu Cement Co., Ltd., Japan

[21] Appl. No.: 218,744

[22] Filed: Mar. 28, 1994

Related U.S. Application Data

[63] Continuation-in-part of Ser. No. 182,574, Jan. 18, 1994, which is a continuation of Ser. No. 891,937, May 29, 1992, abandoned.

[30] Foreign Application Priority Data

Mar. 29, 1993 [JP] Japan ........................... 5-093740

[51] Int. Cl.⁶ .................................................. C30B 15/02
[52] U.S. Cl. ........................................ 117/16; 117/23
[58] Field of Search ............................. 117/16, 23, 209, 117/921

[56] References Cited

U.S. PATENT DOCUMENTS

| | | | |
|---|---|---|---|
| 3,527,574 | 9/1970 | Labelle, Jr. | 117/23 |
| 3,870,477 | 3/1975 | Labelle, Jr. | 23/301 SP |
| 4,184,907 | 1/1980 | Yates | 117/16 |

FOREIGN PATENT DOCUMENTS

| | | |
|---|---|---|
| 62-270500 | 11/1987 | Japan . |
| 3-12397 | 1/1991 | Japan . |

OTHER PUBLICATIONS

"EFG, The Invention And Application To Sapphire Growth"; Labelle, Jr., J. Cryst. Growth 50 (1980) pp. 8–17.

*Primary Examiner*—Robert Kunemund
*Assistant Examiner*—FeLisa Garrett
*Attorney, Agent, or Firm*—Zarley, McKee, Thomte, Voorhees, & Sease

[57] ABSTRACT

A method of growing a rod form of a single oxide crystal is disclosed. The method uses a slit die which is placed in a crucible with a starting melt. The melt is seeded with a seed crystal while being rotated. The resulting crystal will have the same sectional shape as the shape of the upper surface of the die.

11 Claims, 2 Drawing Sheets

GROWTH METHOD FOR A ROD FORM OF SINGLE OXIDE CRYSTAL

CROSS REFERENCE TO A RELATED APPLICATION

This application is a continuation-in-part of U.S. application Ser. No. 08/182,574, filed Jan. 18, 1994 by inventors Machida, et al., entitled RUTILE SINGLE CRYSTALS AND THEIR GROWTH PROCESS, which is a continuation of U.S. application Ser. No. 07/891,937, filed May 29, 1992 by inventors Machida, et al., entitled RUTILE SINGLE CRYSTALS AND THEIR GROWTH PROCESS, now abandoned.

BACKGROUND OF THE INVENTION

This invention relates to a process for growing a rod form of single oxide crystal by the edge-defined film-fed growth (EFG) method.

PRIOR ART

The EFG method that is a crystal growth method is known to be capable of pulling up a crystal according to the geometry of a die. The principle will now be explained with reference to FIG. 2. A crucible 1 is filled with a melt 2, in which a die 3 slit at 4 is placed. In this case, the melt 2 goes up to the upper surface of the die 3 through the slit 4. Then, a seed crystal 5, which is deposited onto the melt on the upper surface of the die, is pulled up at any desired rate, thereby obtaining a crystal 6 according to the geometry of the die. Never until now is there any report about the growth of a round rod form of crystal whose sectional shape is the same as the shape of the upper surface of the die by the EFG method in association with the rotation of a seed crystal. A modification of the EFG method making use of the rotation of a seed crystal is reported on the crystal growth of $Gd_2(MoO_4)_3$ in "Journal of Crystal Growth", 104, pp. 77–79 (1990). This publication shows the results of crystal growth occurring from the square upper surface of a die under such conditions that the melt meniscus is not constrained by the shape of the die, and reports that the geometrical instability of the crystal varies depending on the rpm of the seed crystal and that crystal geometry is stabilized at a low rpm. However, the growth process of the $Gd_2(MoO_4)_3$ crystal is quite different from that of a single oxide crystal like a single crystal of rutile. In other words, the $Gd_2(MoO_4)_3$ crystal can be grown even by Czochralski's method for pulling up a crystal directly from a melt without recourse to a die, but that method has much difficulty in the growth of a rod form of rutile crystal, because there is a large shape variation. In this regard, see "Journal of Crystal Growth", 112, pp. 835–837 (1991).

This invention relates to a technique for the growth of a rod form of single oxide crystal of good quality. It is here to be noted that only by optimization of the rpm of a seed crystal is it impossible to control the shape of a single oxide crystal such as a single rutile crystal. That is, never until now is there any report on the growth of a crystal which cannot be grown by Czochralski's method without difficulty but can be somehow grown by the EFG method.

A rod form of rutile crystal may be grown by crystal pulling methods such as Bernoulli's method or the floating method. Large crystals are advantageously grown by the crystal pulling methods, but plate crystals are produced only by use of a modification of the EFG method making no use of the rotation of a seed crystal. However, a rod form of crystals suitable for mass production are not still obtained.

In the growth of crystals by the EFG method meniscus height is low, because the temperature around the interface of crystal growth is lower than that of usual Czochralski's method. This renders the temperature distribution of the interface of crystal growth likely to be affected by heat radiation from the upper surface of the die. Plate crystal growth is most unlikely to be affected by heat radiation, because the growing crystal is so thin that the efficiency of heat dissipation can be increased. However, some problem arises when a rod form of crystal of at least 10 mm in diameter is grown. That is, since the melt in the slits and a portion (made up of iridium) of the die except the slits differ in terms of the amount of heat radiation, the vicinity of the growth interface has a temperature distribution corresponding to the slit pattern of the upper surface of the die, resulting in the occurrence of strain conforming to the slit pattern in the crystal. The crucible and die used with rutile is made up of iridium because its melting point is as high as about 1,850° C., and the partial pressure of oxygen in the crystal growth atmosphere is generally limited to about 3% or lower. Hence, the grown crystal is so large in terms of oxygen deficiency that it absorbs light including ultraviolet rays radiating from the upper surface of the die. This causes a portion of the upper surface of the die covered by the crystal to differ largely from an uncovered portion of the upper surface of the die in terms of the amount of heat radiation, resulting in a variation in the temperature distribution across the upper surface of the die, although depending on the shape of the growing crystal. A rod form of crystal, when grown by the EFG method, is thus likely to grow in the radial direction on the upper surface of the die, rendering shape control difficult. Moreover, when the upper surface of the die has some considerable temperature distribution or the temperature of the upper surface of the die is too low at the time of growth initiation, the shape of a crystal growing from the seed crystal becomes asymmetrical with respect to the axis of rotation, although depending on the temperature distribution of the upper surface of the die. Alternatively, a crystal grows rapidly just after the seed crystal contacts the melt on the upper surface of the die, although depending on the temperature distribution across the upper surface of the die, making crystal growth unlikely to occur symmetrically with respect to the axis or rotation. As a result, the geometry of the shoulder of the crystal becomes asymmetrical with respect to the axis of rotation, so that the amount of heat radiating from the crystal interface varies, resulting in the occurrence of a spiral crystal and so making shape control difficult.

When a rod form of crystal of at least 10 mm in diameter is grown by the EFG method, the crystallinity and growth stability of the growing crystal are affected by the asymmetry and magnitude of the temperature distribution across the upper surface of the die and the growth atmosphere. That is, when the temperature distribution across the upper surface of the die and the growth atmosphere are asymmetrical, the crystal growth rate and the cooling rate of the grown crystal vary from place to place. This poses problems that thermal strain remains in the crystal plane depending on such asymmetry, and an increase in the asymmetry results in an increase in the amount of strain, so making cracking likely to occur.

When the asymmetry and magnitude of such temperature distributions are increased, there is a large variation of crystal shape, which in turn makes shape control difficult. Such a shape variation makes crystal deficiency likely to occur and so boundaries likely to occur in the crystal.

Especially for the growth of a single crystal of rutile, it is essentially required to use a die having a circular upper surface with the directional variation in diameter being up to 20% of the average diameter, carry out crystal growth under such a condition that the range of the temperature distribution across the upper surface of the die is up to 10° C., and initiate crystal growth after the seed crystal is brought in contact with a melt on the upper surface of the die at a temperature of the upper surface of the die that is higher than that of the melt by at least 10° C.

This invention has been made so as to provide a solution to the problems mentioned above, and has for its object to provide a growth method for a rod form of single oxide crystal, which makes it possible to obtain a large rod form of crystal of good quality.

SUMMARY OF THE INVENTION

More specifically, this invention provides a growth method for growing a rod form of single oxide crystal from a melt in a vessel which is filled therein with a controlled atmosphere and in which a crucible is placed together with a starting melt, wherein:

a slit die is placed in said crucible to allow the melt to go up to the upper surface of the die through the die, and the melt is seeded with a seed crystal while rotated, thereby growing a rod form of crystal having the same sectional shape as the shape of the upper surface of the die.

Preferably, the single crystal of oxide is a single crystal of rutile.

Preferably, the crystal growth occurs from the round upper surface of the die with the directional variation in diameter being up to 20% of the average diameter.

Preferably, the range of the temperature distribution of the upper surface of the die is up to 10° C.

Preferably, the crystal growth is initiated by seeding the melt on the upper surface of the die with the seed crystal at a temperature of the upper surface of the die that is higher than that of the melt by 10° C. or higher.

BRIEF DESCRIPTION OF THE DRAWINGS

This invention will now be explained more specifically but not exclusively with reference to the accompanying drawings, in which.

DETAILED EXPLANATION OF THE INVENTION

Figure 1:
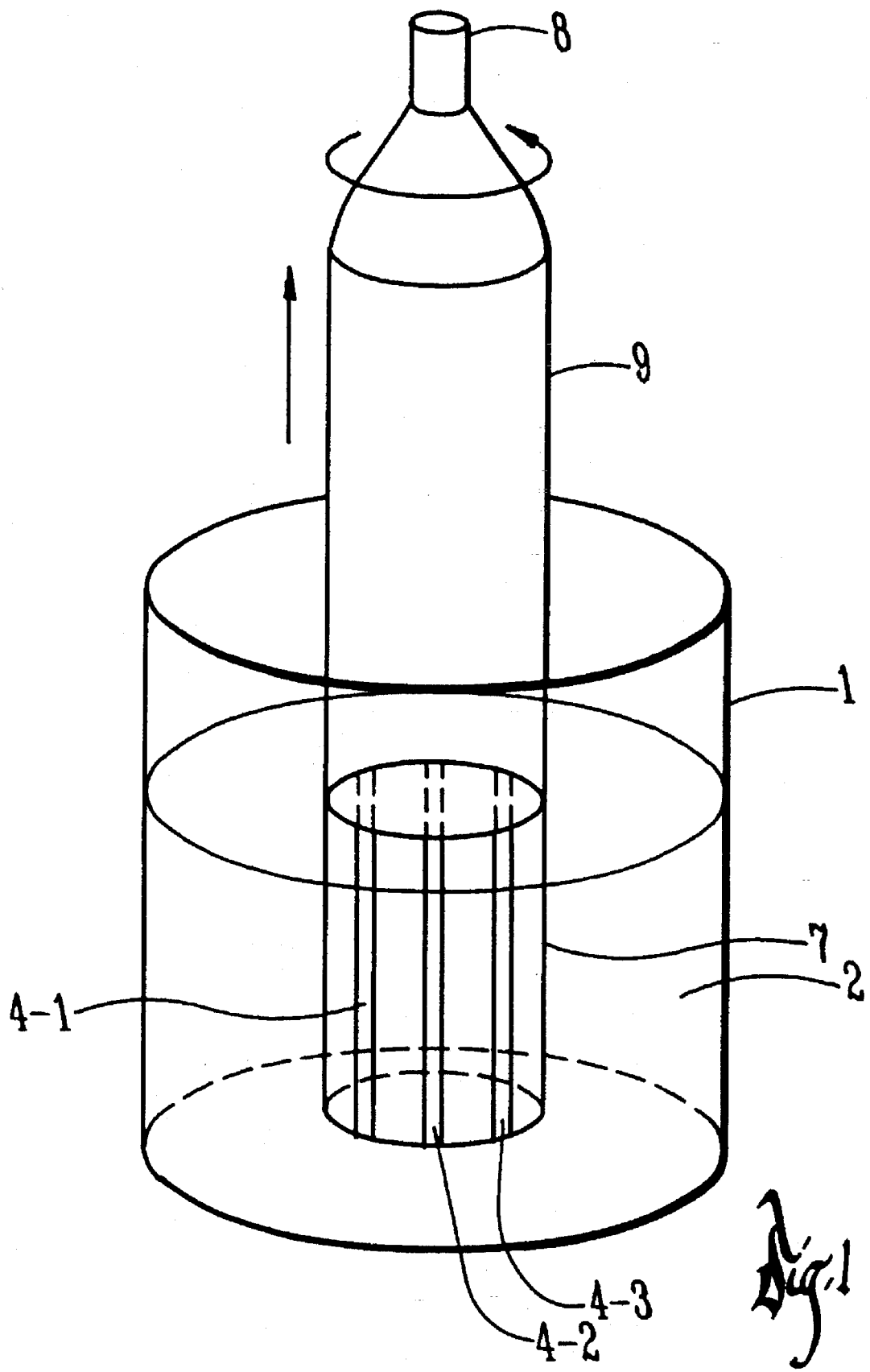
FIG. 1 illustrates one embodiment of the invention.
Figure 2:
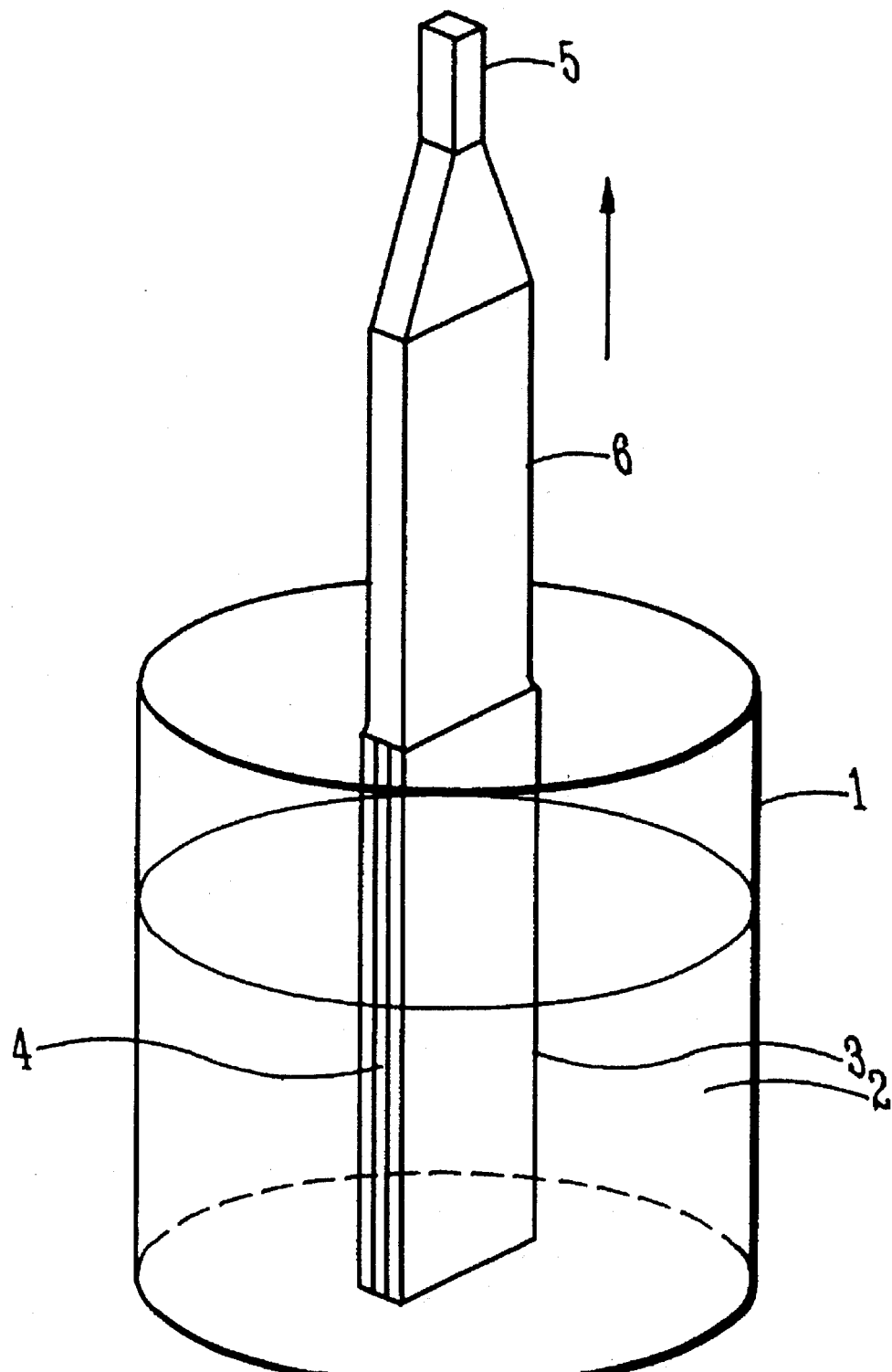
FIG. 2 illustrates a conventional growth process.

FIG. 1 illustrates one embodiment of the invention, wherein 7 stands for a rod form of die of, for instance, 15 mm in diameter and 25 mm in height, which is slit at 4-1, 4-2 and 4-3, as illustrated. Reference numeral 8 represents a seed crystal, and 9 denotes a grown columnar crystal. The die 7 is placed on the middle of the bottom of a crucible 1 of, for instance, 50 mm in diameter and 25 mm in height.

EXAMPLES

This invention will now be explained by way of example but not by way of limitation with reference to some examples.

EXAMPLE 1

In the crucible 1, 130 g of $TiO_2$ was melted by high-frequency induction heating. The melt going up to the upper surface of the die was seeded with the seed crystal 8, and then pulled up in the C-axis direction at 5 mm/h. The seed crystal was rotated at 0 rpm and 5 rpm. In this way a rod form of crystal of 15 mm in diameter and 40 mm in height was grown. The rod crystal was then cut in the direction perpendicular the pulling-up direction to obtain wafers for observation under a polarizing microscope. As a result, the grown crystal, obtained at 0 rpm, was observed to contain strains corresponding to the slits and boundaries resulting from a difference in the temperature distribution in the plane parallel to the wafer surface. The grown crystal, obtained at 5 rpm, however, was observed to contain neither strains nor boundaries.

EXAMPLE 2

Two dies having round and square upper surfaces were used to grow a rod form of rutile crystals while the seed crystal was rotated at 5 rpm. With the round die, a round rod form of crystal stabilized in terms of shape was obtained. With the square die, on the other hand, a crystal shoulder of a substantially square shape in section was somehow obtained. Thereafter, however, a large shape variation occurred, so making shape control impossible. Each of the crystals was cut to obtain a wafer for observation under a polarizing microscope. As a result, while the wafer of the latter crystal was observed to contain strains resulting from the periphery due to the shape variation, the wafer of the former crystal was found to contain no such strains. With a round die with the diametrical variation being more than 20% of the average diameter, the resulting crystal was low in terms of the shape symmetry of its shoulder, with the crystallinity being similar to that obtained with the square die.

EXAMPLE 3

A die of 15 mm in diameter with a small diametrical variation was used to grow single rutile crystals from the upper surface of the die while the range of the temperature distribution across the upper surface of the die was set at 5° C., 10° C. and 15° C. At 5° C. and 10° C. the growth of crystals occurred symmetrically from the seed crystal, so that the symmetry of the shoulders of the crystals could be high. At 15° C., however, crystal growth occurred in correspondence to the temperature distribution of the upper surface of the die after the melt was seeded with the seed crystal. The shape of the crystal was not affected by the rotation of the seed crystal and so was of so elliptical shape that the shoulder of the crystal remained low. The former crystal was found to have stable torso and shoulder portions, but the latter crystal underwent large shape variations due to an increase in the temperature of the upper surface of the die after the crystal had grown to about 10 mm; that is, the crystal was twisted due to the so-called spiral growth, which was thereafter not eliminated. The crystallinity of each of the resulting crystals was similar to that of the crystals obtained in Example 2. The crystal grown at 15° C. was observed to contain strains due to the shape variation. The seed crystal was rotated at 5 rpm.

EXAMPLE 4

A die similar to that used in Example 3 was used while the range of the temperature distribution across the upper surface of the die was set at 10° C. and the upper surface temperature of the die, at which the melt was seeded on the upper surface of the die with the seed crystal, was made equal to, and 10° C. higher than, the temperature of the melt, for the purpose of examining how the shoulders of the crystals were grown. At the temperature of the melt, the moment the melt was seeded with the seed crystal, the crystal spread asymmetrically in the radial direction, although depending on the temperature distribution of the upper surface of the die. This asymmetry was not eliminated by the rotation of the seed crystal, resulting in the formation of the crystal shoulder of low symmetry. At the temperature 10° C. higher than the temperature of the melt, the shoulder of the resulting crystal was of high symmetry. At the temperature of the melt the torso of the crystal was instabilized in terms of shape, while at the latter temperature, no difficulty was encountered in shape control as in the case of Example 3. This was due to difference the symmetry of the shoulders of the crystals. The crystals were equivalent to those of Example 3 in terms of crystallinity. At the former temperature the resulting crystal was observed to contain strains due to the shape variation. The seed crystal was rotated at 5 rpm.

EFFECT OF THE INVENTION

According to the growth method of this invention wherein crystal growth occurs while the seed crystal is rotated, there is no difference in heat radiation across the upper surface of the die; that is, strains corresponding to the slit pattern of the upper surface of the die are unlikely to be introduced in the crystal. There is also no difference in the thermal history across the grown crystal, which may vary due to the asymmetry of the temperature distribution of the upper surface of the die and the growth atmosphere. Especially for the purpose of growing a rod form of rutile crystal of controlled shape, it is required to use a die having a round upper surface with the diametrical variation reduced as much as possible, thereby growing a crystal having a sectional shape substantially similar to the shape of the upper surface of the die. This is because the rutile crystal grows at a faster rate on the upper surface of the die. By use of such a die it is possible to avoid any unconformity between the growth interface of the growing crystal and the shape of the upper surface of the die (which may occur due to the rotation of the seed crystal) and so a large temperature variation of the growth interface and the upper surface of the die, a variation in the shape of the crystal, etc. As the seed crystal rotates at a high rpm, there is generally a large shift from the upper surface of the die from horizontal, which causes a large variation in the shape of the growth interface of the crystal, and causes more melt to go up through the slits, making the shape of the growth interface of the crystal largely concave on the crystal side. Thus, crystal growth is likely to be unstable. The rpm at which stable crystal growth occurs varies depending on the diameter of the crystal to be grown. As a result of studies made of the growth of a rod form of crystal of 15 mm in diameter at 10 rpm or less, it has been found that the rpm of the seed crystal at which stable crystal growth occurs is 5 rpm or lower. If crystal growth occurs while the range of the temperature distribution of the upper surface of the die is set at 10° C. or lower or while the upper surface temperature of the die, at which crystal growth begins, is made higher than that of the melt by 5° C. or more, crystal growth occurs symmetrically around the axis of rotation, not rapidly, so that the growth of the shoulder of the crystal can occur symmetrically with respect to the axis of rotation, making it possible to control the shape of the torso of the crystal.

What is claimed is:

1. A growth method for growing a rod form of single oxide crystal from a melt in a vessel which is filled therein with a controlled atmosphere and in which a crucible is placed with a starting melt, wherein:

a slit die is placed in said crucible to allow the melt to go up to the upper surface of the die through the slits, and the melt is seeded with a seed crystal while rotated, thereby growing a rod form of crystal having the same sectional shape as the shape of the upper surface of the die.

2. A growth method as recited in claim 1, wherein the single crystal of oxide is a single crystal of rutile.

3. A growth method as recited in claim 2, wherein the crystal growth occurs from the round upper surface of the die with the directional variation in diameter being up to 20% of the average diameter.

4. A growth method as recited in claim 2, wherein the range of the temperature distribution of the upper surface of the die is up to 10° C.

5. A growth method as recited in claim 2, wherein the crystal growth is initiated by seeding the melt on the upper surface of the die with the seed crystal at a temperature of the upper surface of the die that is higher than that of the melt by 10° C. or higher.

6. A growth method for growing a rod form of single oxide crystal having a circular cross-section 10 mm or more in diameter from a melt in a vessel which is filled therein with a controlled atmosphere and in which an iridium crucible is placed with a starting melt, consisting of:

placing in a crucible an iridium slit die, having a circular cross-section whose directional variation in diameter is less than 20%, to allow the melt to go up to the upper surface of the die through the slits;

seeding the melt with a seed crystal while rotated; and growing a rod form of crystal having substantially the same sectional shape as the shape of the upper surface of the die.

7. The method according to claim 6 wherein the rotational speed of the seed crystal is 5 rpm or less.

8. The method according to claim 6 wherein the single oxide crystal is a single crystal of rutile.

9. The method according to claim 6 wherein the range of the temperature distribution of the upper surface of the die is up to 10° C.

10. The method according to claim 6 wherein the temperature of the upper surface of the die is kept higher than that of the melt by 5° C. or higher.

11. The method according to claim 10 wherein the temperature of the upper surface of the die is kept higher than that of the melt by 10° C. or higher.

\* \* \* \* \*